(12) United States Patent
Chan et al.

(10) Patent No.: US 12,278,646 B2
(45) Date of Patent: Apr. 15, 2025

(54) ANALOG TO DIGITAL CONVERTER HAVING MECHANISM OF DETECTING INPUT VOLTAGE RANGE AND SIGNAL CONVERSION METHOD THEREOF

(71) Applicant: REALTEK SEMICONDUCTOR CORPORATION, Hsinchu (TW)

(72) Inventors: Chun-Chieh Chan, Hsinchu (TW); Heng-Yi Chen, Hsinchu (TW); Yi-Cheng Lin, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 191 days.

(21) Appl. No.: 18/132,993

(22) Filed: Apr. 11, 2023

(65) Prior Publication Data
US 2024/0022256 A1    Jan. 18, 2024

(30) Foreign Application Priority Data

Jul. 14, 2022    (TW) .................................. 111126487

(51) Int. Cl.
*H03M 1/38* (2006.01)
*H03M 1/12* (2006.01)

(52) U.S. Cl.
CPC ............. *H03M 1/124* (2013.01); *H03M 1/38* (2013.01)

(58) Field of Classification Search
CPC ................................ H03M 1/124; H03M 1/38
USPC .................................................. 341/155, 159
See application file for complete search history.

(56) References Cited

U.S. PATENT DOCUMENTS

| | | | |
|---|---|---|---|
| 5,739,781 A | 4/1998 | Kagey | |
| 6,377,196 B1* | 4/2002 | Kolsrud | H03M 1/187 341/131 |
| 9,276,599 B2* | 3/2016 | Liaghati | H03M 1/12 |
| 2004/0246154 A1* | 12/2004 | Aeby | H04N 25/00 341/138 |
| 2016/0054745 A1* | 2/2016 | Sawyers | G06F 1/26 324/71.1 |

OTHER PUBLICATIONS

OA letter of a counterpart TW application (appl. No. 111126487) mailed on Jun. 2, 2023. Summary of the TW OA letter: Claims 1-10 are rejected as allegedly being unpatentable over cited reference 1 (U.S. Pat. No. 5739781). PS.Correspondence between claims of TW counterpart application and claims of US application: Claims 1-9 and 10 in TW counterpart application correspond to claims 1-9 and 13 in US application, respectively.

* cited by examiner

*Primary Examiner* — Peguy Jean Pierre
(74) *Attorney, Agent, or Firm* — WPAT, PC

(57) ABSTRACT

An analog to digital converter includes voltage divider circuits, front-end circuits, at least one converter circuit, and a controller circuit. The voltage divider circuits are configured to divide an input signal to generate first signals, in which the first signals have different levels. The front-end circuits are configured to respectively sample the first signals to generate second signals. The at least one converter circuit is configured to generate at least one digital output according to the second signals and a reference voltage. The controller circuit is configured to determine a level of the input signal according to the at least one digital output and select one of the at least one digital output according to the level of the input signal.

20 Claims, 3 Drawing Sheets

ANALOG TO DIGITAL CONVERTER HAVING MECHANISM OF DETECTING INPUT VOLTAGE RANGE AND SIGNAL CONVERSION METHOD THEREOF

BACKGROUND OF THE INVENTION

1. Field of the Invention

The present disclosure relates to an analog to digital converter. More particularly, the present disclosure relates to an analog to digital converter having a mechanism of detecting an input voltage range and a signal conversion method thereof.

2. Description of Related Art

Analog to digital converters can convert analog signals into digital signals for subsequent digital signal processing(s). In general, a voltage detection range of analog to digital converters is limited by a reference voltage received by the analog to digital converters. In addition, under the condition that the voltage detection range is unchanged, if the effective number of bits of the analog digital converter is higher, the analog to digital converter can have a finer voltage resolution. In the existing approach, if an analog to digital converter is required to have a large voltage detection range and have a fine resolution in low voltage range, the effective number of bits of the analog to digital converter may be increased to meet the above requirements. However, the above approach is required to ensure that the analog-digital converter has a sufficient noise immunity in the low voltage range. As a result, considerable hardware cost is needed to implement such analog to digital converter in practical applications.

SUMMARY OF THE INVENTION

In some aspects, one object of the present disclosure is, but not limited to, to provide an analog to digital converter having a mechanism of detecting an input voltage range and a signal conversion method that are able to prevent the problems of the prior art.

In some aspects, an analog to digital converter includes a plurality of voltage divider circuits, a plurality of front-end circuits, at least one converter circuit, and a controller circuit. The plurality of voltage divider circuits are configured to divide an input signal to generate a plurality of first signals, in which the plurality of first signals have different levels. The plurality of front-end circuits are configured to respectively sample the plurality of first signals to generate a plurality of second signals. The at least one converter circuit is configured to generate at least one digital output according to the plurality of second signals and a reference voltage. The controller circuit is configured to determine a level of the input signal according to the at least one digital output and select one of the at least one digital output according to the level of the input signal.

In some aspects, a signal conversion method includes the following operations: dividing an input signal to generate a plurality of first signals having different levels; respectively sampling the plurality of first signals to generate a plurality of second signals; generating at least one digital output according to the plurality of second signals and a reference voltage; and determining a level of the input signal according to the at least one digital output and selecting one of the at least one digital output according to the level of the input signal.

These and other objectives of the present disclosure will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other. In this document, the term "circuitry" may indicate a single system that is formed with at least one circuit, and the term "circuit" may indicate an object, which is formed with one or more transistors and/or one or more active/passive elements based on a specific arrangement, for processing signals.

As used herein, the term "and/or" includes any and all combinations of one or more of the associated listed items. Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. For ease of understanding, like elements in various figures are designated with the same reference number.

Figure 1:
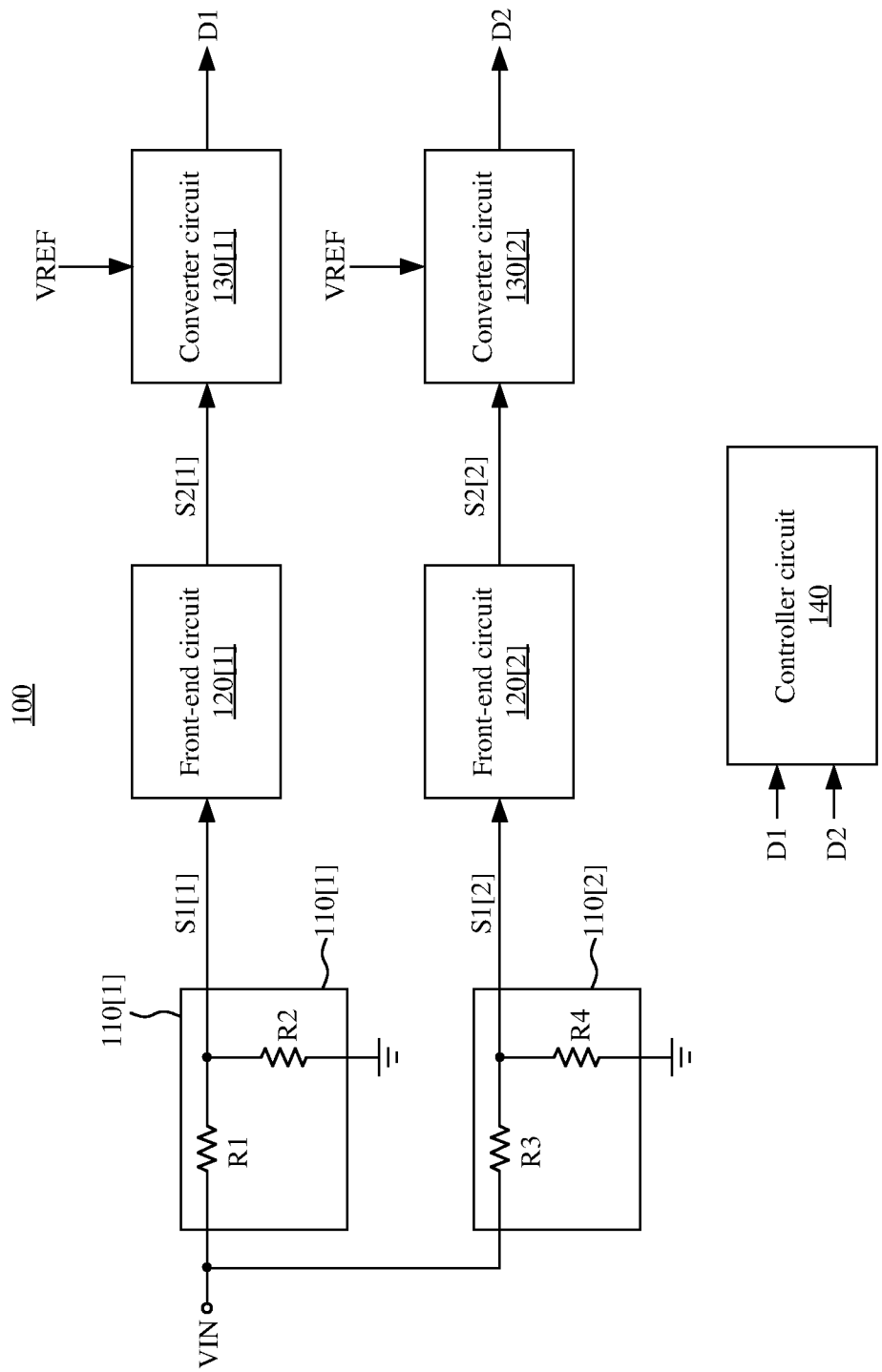
FIG. 1 illustrates a schematic diagram of an analog to digital converter according to some embodiments of the present disclosure.

FIG. 1 illustrates a schematic diagram of an analog to digital converter 100 according to some embodiments of the present disclosure. The analog to digital converter 100 includes voltage divider circuits 110[1] and 110[2], front-end circuits 120[1] and 120[2], converter circuits 130[1] and 130[2], and a controller circuit 140. The voltage divider circuits 110[1] and 110[2] may divide an input signal VIN to generate a signal S1[1] and a signal S1[2], in which the signal S1[1] and the signal S1[2] have different levels. For example, the voltage divider circuit 110[1] and the voltage divider circuit 110[2] are set to have different voltage divider ratios and may divide the input signal VIN according to the respective voltage divider ratio, in order to generate the signal S1[1] and the signal S1[2] that have difference levels.

In greater detail, the voltage divider circuit 110[1] includes resistors R1 and R2, and the voltage divider circuit 110[2] includes a resistor R3 and a resistor R4. A first terminal of the resistor R1 receives the input signal VIN, a second terminal of the resistor R1 is coupled to a first terminal of the resistor R2 and generates the signal S1[1], and a second terminal of the resistor R2 is coupled to ground. A first terminal of the resistor R3 receives the input signal VIN, a second terminal of the resistor R3 is coupled to a first terminal of the resistor R4 and generates the signal S1[2], and a second terminal of the resistor R4 is coupled to ground. In an example, a voltage divider ratio of the voltage divider circuit 110[1] may be configured to be 9:1, and a voltage divider ratio of the voltage divider circuit 110[2] may be configured to be 24:1. In other words, a resistance value of the resistor R1 may be configured to be 9 times a resistance value of the resistor R2, and a resistance value of the resistor R3 may be configured to be 24 times a resistance value of the resistor R4. As a result, the signal S1[1] and the signal S1[2] have different levels can be generated.

The above arrangements of the voltage divider circuits 110[1] and 110[2] are given for illustrative purposes, and the present disclosure is not limited thereto. Various circuit arrangements able to divide the input signal VIN are within the contemplated scope of the present disclosure.

The front-end circuits 120[1] and 120[2] may respectively sample the signal S1[1] and the signal S1[2], in order to generate a signal S2[1] and a signal S2[2]. In greater detail, the front-end circuit 120[1] is coupled to the voltage divider circuit 110[1], in order to sample the signal S1[1] and generate the signal S2[1]. Similarly, the front-end circuit 120[2] is coupled to the voltage divider circuit 110[2], in order to sample the signal S1[2] to generate the signal S2[2]. In some embodiments, each of the front-end circuits 120[1] and 120[2] may be implemented with a sample and hold circuit.

In some embodiments, each of the front-end circuits 120[1] and 120[2] may have an overvoltage protection mechanism which prevents levels of signals provided into the converter circuits 130[1] and 130[2] (e.g., the signal S2[1] and/or the signal S2[2]) from exceeding the reference voltage VREF, in order to prevent the converter circuits 130[1] and 130[2] from being damaged. In some embodiments, the overvoltage protection mechanism may be implemented with a clamping circuit. For example, the front-end circuit 120[1] may have serval Schottky diodes (not shown), in which one Schottky diode is coupled between an output terminal that outputs the signal S2[1] and ground, and another one Schottky diode is coupled between an output terminals that outputs the signal S2[1] and a node that generates the reference voltage VREF. Accordingly, the voltage range on the output terminals that outputs the signal S2[1] is limited between zero volt to the reference voltage VREF. Moreover, with the aforementioned overvoltage protection mechanism, it is able to allow a maximum level of each of the signal S1[1] and the signal S1[2] to be higher than the reference voltage VREF. As a result, it is able to increase a voltage application range of the analog to digital converter 100. In some embodiments, the overvoltage protection mechanism may be implemented in the front-end circuits 120[1] and 120[2]. In some other embodiments, the front-end circuits 120[1] and 120[2] may be arranged on a printed circuit board, and the overvoltage protection mechanism may be implemented on the printed circuit board.

A corresponding one of the converter circuits 130[1] and 130[2] generates a digital output D1 and a digital output D2 according to the reference voltage VREF and a corresponding one of the signals S2[1] and S2[2]. Specifically, the converter circuit 130[1] is coupled to the front-end circuit 120[1], in order to receive the signal S2[1] and generates the digital output D1 according to the signal S2[1] and the reference voltage VREF. Similarly, the converter circuit 130[2] is coupled to the front-end circuit 120[2], in order to receive the signal S2[2] and generates the digital output D2 according to the signal S2[2] and the reference voltage VREF. In some embodiments, each of the converter circuits 130[1] and 130[2] may compare the reference voltage VREF with a corresponding one of the signal S2[1] and the signal S2[2], in order to generate a corresponding one of the digital output D1 and the digital output D2. In some embodiments, each of the converter circuits 130[1] and 130[2] may include, but not limited to, a comparator circuit and/or a control logic circuit that perform an analog to digital conversion algorithm in an analog to digital converter circuit. For example, each of the converter circuits 130[1] and 130[2] may include relevant circuit(s) able to perform a conversion algorithm of one of a digital slope analog to digital converter, a successive approximation register analog to digital converter, a flash analog to digital converter, and so on. The converter circuit 130[1] (or 130[2]) may set the reference voltage VREF to be a reference value of a maximum detectable voltage and compare the reference voltage VREF with the corresponding signal S2[1] (or S2[2]) to generate the corresponding digital output D1 (or D2).

The types of the analog to digital conversion algorithms are given for illustrative purposes, and the present disclosure is not limited thereto. Various analog to digital conversion algorithms are able to implement related operations of the converter circuits 130[1] and 130[2].

The controller circuit 140 may determine the level of the input signal VIN according to the digital output D1 and the digital output D2 and select the digital output D1 or the digital output D2 according to the level of the input signal VIN. In some embodiments, operations of the controller circuit 140 may be performed by firmware or software in the system. In some embodiments, the controller circuit 140 may include register circuits (not shown) and a control logic circuit (not shown). The register circuits may store the digital output D1 and the digital output D2, respectively. The control logic circuit may obtain the digital output D1 and the digital output D2 from the register circuits and determine whether to select the digital output D1 or the digital output D2 to be a valid digital output for subsequent data processing. In some embodiments, operations of the control logic circuit may be, but not limited to, implemented with a finite state machine. In some embodiments, operations of the control logic circuit may be performed by firmware or software in the system.

As mentioned above, the voltage divider circuits 110[1] and 110[2] have different voltage divider ratios. With such arrangement, the voltage range of the input signal VIN after being converted by the front-end circuit 120[1] and the voltage range of the input signal VIN after being converted by the front-end circuit 120[2] may be partially overlapped or different from each other. For example, in an application, a voltage range of the input signal VIN to be detected is 0-50 volts, and a detection error of 5 volts and 50 volts is required to be less than or equal to 2%. In other words, when detecting the low voltage of 5 volts, the voltage resolution is at least 100 millivolts (mV), and when detecting the high voltage of 50 volts, the voltage resolution is at least 1 volt.

It is assumed that the effective number of bits of the analog to digital converter 100 is 8, and the reference voltage VREF is set to be 2 volts. Under this condition, the resistance ratio between the resistor R1 and the resistor R2 may be set to 9:1. As a result, the voltage divider circuit 110[1] may divide the input signal VIN based on a voltage divider ratio of 9:1, in order to generate the signal S1[1] having a voltage range of 0-5 volts. When a level of the input signal VIN is higher than 20 volts, the level of the signal S1[1] (i.e., 2 volts) may be equal to the reference voltage VREF, such that the digital output D1 has a maximum value (e.g., 8 bits of the digital output D1 are all logic values of 1. In other words, the voltage detection range of the front-end circuit 120[1] (and the converter circuit 130[1]) is 0-20 volts, and the voltage resolution in this voltage detection range is 78.125 mV (i.e., $20/2^8$).

Similarly, the resistance ratio between the resistor R3 and the resistor R4 may be set to 24:1. As a result, the voltage divider circuit 110[2] may divide the input signal VIN based on a voltage divider ratio of 24:1, in order to generate the signal S1[2] having a voltage range of 0-2 volts. Under this condition, when the level of the input signal VIN reaches 50 volts, the level of the signal S1[2] (i.e., 2 volts) may be equal to the reference voltage VREF, such that the digital output D2 has a maximum value (e.g., 8 bits of the digital output D2 are all logic values of 1). In other words, the voltage detection range of the front-end circuit 120[2] (and the converter circuit 130[2]) is 0-50 volts, and the voltage resolution in this voltage detection range is 195.3125 mV (i.e., $50/2^8$).

It is understood that the voltage resolution is a minimum voltage change able to be measured by an analog to digital converter. If the voltage resolution is finer, the voltage change able to be measured by the analog to digital converter is lower, which indicates that the analog to digital converter has higher accuracy. With the above arrangements, the voltage resolution of the front-end circuit 120[1] (and the converter circuit 130[1]) may be lower than the voltage resolution of the front-end circuit 120[2] (and the converter circuit 130[2]), such that the accuracy of the front-end circuit 120[1] (and the converter circuit 130[1]) is higher than the accuracy of the front-end circuit 120[2] (and the converter circuit 130[2]). When the level of the input signal VIN is within the lower voltage detection range (i.e., 0-20 volts), the digital output D1 generated by the front-end circuit 120[1] (and the converter circuit 130[1]) having higher accuracy is utilized for subsequent signal processing. Alternatively, when the level of the input signal VIN exceeds that voltage detection range (i.e., 0-20 volts), the digital output D2 generated by the front-end circuit 120[2] (and the converter circuit 130[2]) is utilized for subsequent signal processing.

The controller circuit 140 may determine the level of the input signal VIN according to the digital output D1 and the digital output D2 and select a corresponding one of the digital output D1 and the digital output D2 for subsequent processing. For example, if the digital output D1 does not reach its maximum value, it indicates that the level of the input signal VIN does not exceed the voltage detection range of the front-end circuit 120[1] (e.g., 0-20 volts). Under this condition, the controller circuit 140 may select the digital output D1 having higher accuracy for subsequent processing. Alternatively, if the digital output D1 reaches the maximum value (i.e., all bits are logic values of 1) and partial bit(s) of the digital output D2 is/are switched to be logic value(s) of 1, it indicates that the level of the input signal VIN exceeds the voltage detection range of the front-end circuit 120[1] and is within the voltage detection range of the front-end circuit 120[2] (e.g., 0-50 volts). Under this condition, the controller circuit 140 may select the digital output D2 (which is generated based on the signal S2[2] that is generated by the front-end circuit 120[2]) for subsequent processing. In the above examples, the voltage range of the input signal VIN converted by the front-end circuit 120[1] (which is referred to as a first voltage range hereinafter) is 0-20 volts, and the voltage range of the input signal VIN converted by the front-end circuit 120[2] (which is referred to as a second voltage range hereinafter) 20-50 volts. In other words, the voltage range converted by the front-end circuit 120[1] and the voltage range converted by the front-end circuit 120[2] are different from each other.

It is understood that, according to different voltage divider ratios, the voltage range converted by the front-end circuit 120[1] and the voltage range converted by the front-end circuit 120[2] may be set to be partially overlapped as well. For example, in other arrangements, the first voltage range is 0-20 volts, and the second voltage range is 15-50 volts. In different embodiments, an upper limit of the second voltage range (e.g., 50 volts) may be higher than that of the first voltage range (e.g., 20 volts). In some embodiments, a lower limit of the second voltage range (e.g., 15 volts) may be equal to or lower than the upper limit of the first voltage range. In some other embodiments, the lower limit of the second voltage range may be higher than the upper limit of the first voltage range.

The above embodiments are given with examples of using two front-end circuits, but the present disclosure is not limited thereto. According to practical requirements, the analog to digital converter 100 may employ more voltage divider circuit, front-end circuits, and converter circuits, in order to define more voltage detection ranges and generate more digital outputs. Moreover, the values of the above voltage divider ratios are given for illustrative purposes, and the present disclosure is not limited thereto.

Figure 2:
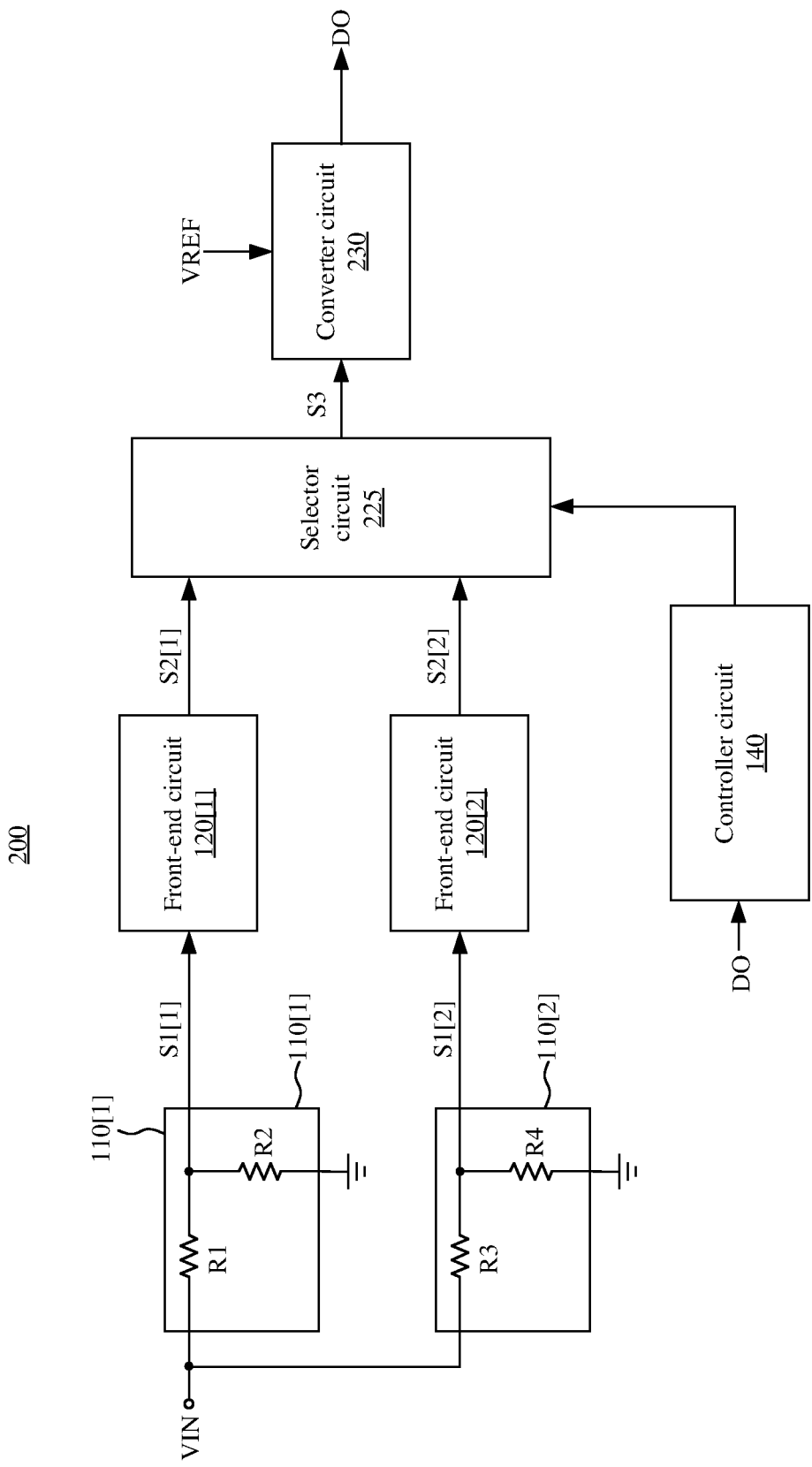
FIG. 2 illustrates a schematic diagram of an analog to digital converter according to some embodiments of the present disclosure.

FIG. 2 illustrates a schematic diagram of an analog to digital converter 200 according to some embodiments of the present disclosure. In this example, the analog to digital converter 200 may operate as a time-interleaved analog to digital converter. Different from FIG. 1, the analog to digital converter 200 includes a selector circuit 225 and a converter circuit 230. The selector circuit 225 may sequentially output the signal S2[1] and the signal S2[2] to be a signal S3, and the converter circuit 230 may generate a digital output DO according to the signal S3 and the reference voltage VREF. In some embodiments, the selector circuit 225 may be a multiplexer circuit and may be controlled by the controller circuit 140. When the controller circuit 140 determines that the level of the input signal VIN is within the first voltage range, the controller circuit 140 may control the selector circuit 225 to output the signal S2[1] to be the signal S3, in order to select the digital output DO that corresponds to the signal S2[1]. Alternatively, when the controller circuit 140 determines that the level of the input signal VIN exceeds the first voltage range and is within the second voltage range, the controller circuit 140 may control the selector circuit 225 to output the signal S2[2] to be the signal S3, in order to select the digital output DO that corresponds to the signal S2[2].

Based on FIG. 1 and FIG. 2, in different embodiments, a number of converter circuit(s) employed by the analog to digital converter may be at least one. For example, in FIG. 1, the front-end circuits 120[1] and 120[2] are arranged corresponding to the converter circuits 130[1] and 130[2], respectively. In FIG. 2, the front-end circuits 120[1] and 120[2] share one converter circuit 230.

Figure 3:
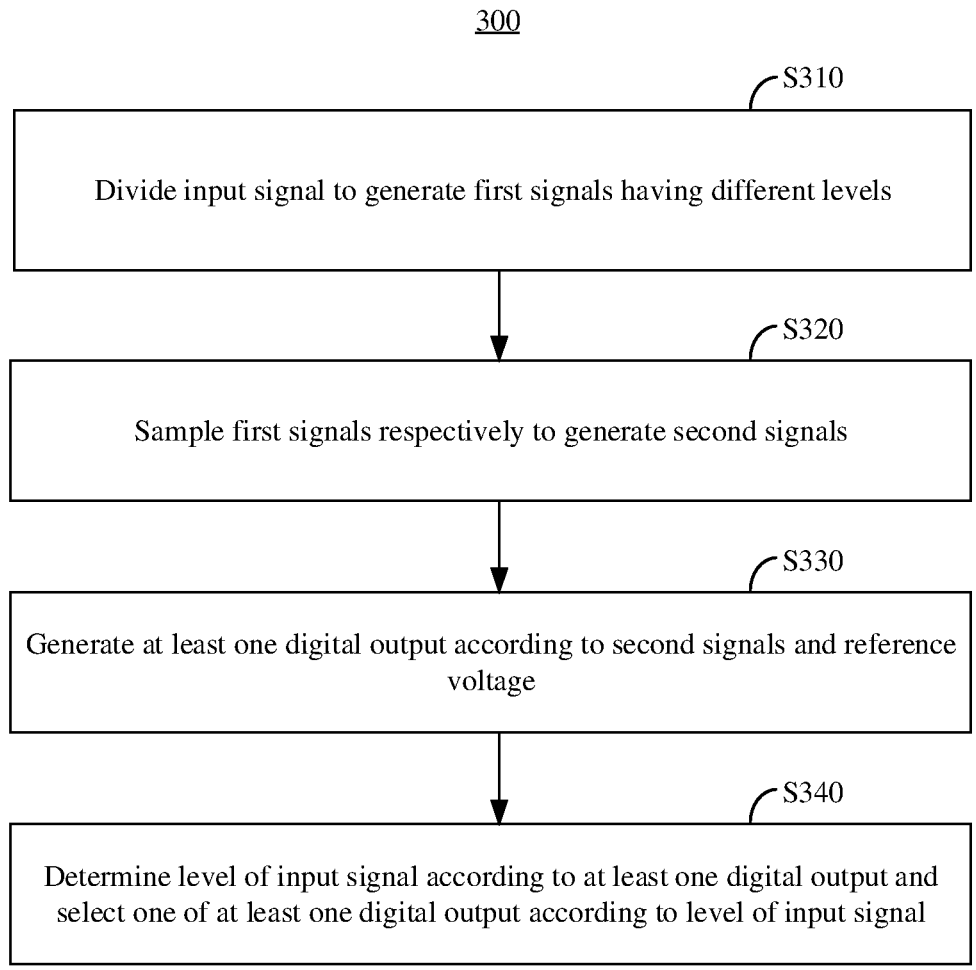
FIG. 3 illustrates a flow chart of a signal conversion method according to some embodiments of the present disclosure.

FIG. 3 illustrates a flow chart of a signal conversion method 300 according to some embodiments of the present disclosure. In operation S310, an input signal is divided to generate first signals having different levels (e.g., the signal S1[1] and the signal S1[2]). In operation S320, the first signals are respectively sampled to generate second signals (e.g., the signal S2[1] and the signal S2[2]). In operation S330, at least one digital output (e.g., the digital output D1, D2, and DO) is generated according to the second signals and a reference voltage (e.g., the reference voltage VREF). In operation S340, a level of the input signal is determined according to the at least one digital output, and one of the at least one digital output is selected according to the level of the input signal.

The above operations of the signal conversion method 300 can be understood with reference to the above various embodiments, and thus the repetitious descriptions are not further given. The above description of the signal conversion method 300 includes exemplary operations, but the operations of the signal conversion method 300 are not necessarily performed in the order described above. Operations of the signal conversion method 300 can be added, replaced, changed order, and/or eliminated, or the operations of the signal conversion method 300 can be executed simultaneously or partially simultaneously as appropriate, in accordance with the spirit and scope of various embodiments of the present disclosure.

As described above, the analog to digital converter and the signal conversion method provided in some embodiments of the present disclosure may detect the level of the input signal to select a converter circuit having appropriate resolution, in order to generate the corresponding digital output. As a result, the voltage detection range of the analog to digital converter can be increased while the accuracy of the analog to digital converter is maintained. Furthermore, the circuit architecture of aforementioned analog to digital converter does not substantially modify its own operations, nor substantially increase the effective number of bits of the analog to digital converter. As a result, it is able to adjust the voltage detection range of the analog to digital converter without increasing costs excessively while maintaining the accuracy.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

The aforementioned descriptions represent merely some embodiments of the present disclosure, without any intention to limit the scope of the present disclosure thereto. Various equivalent changes, alterations, or modifications based on the claims of present disclosure are all consequently viewed as being embraced by the scope of the present disclosure.

What is claimed is:

1. An analog to digital converter, comprising:
    a plurality of voltage divider circuits configured to divide an input signal to generate a plurality of first signals, wherein the plurality of first signals have different levels;
    a plurality of front-end circuits configured to respectively sample the plurality of first signals to generate a plurality of second signals;
    at least one converter circuit configured to generate at least one digital output according to the plurality of second signals and a reference voltage; and
    a controller circuit configured to determine a level of the input signal according to the at least one digital output and select one of the at least one digital output according to the level of the input signal,
    wherein the plurality of front-end circuits comprise a first front-end circuit and a second front-end circuit, the first front-end circuit has a first voltage detection range, the second front-end circuit has a second voltage detection range that is higher than the first voltage detection range, and a voltage resolution of the first front-end circuit is lower than a voltage resolution of the second front-end circuit.

2. The analog to digital converter of claim 1, wherein the plurality of voltage divider circuits have different voltage divider ratios.

3. The analog to digital converter of claim 1, wherein a voltage range of the input signal converted by the first front-end circuit and a voltage range of the input signal converted by the second front-end circuit are partially overlapped or different from each other.

4. The analog to digital converter of claim 1, wherein each of the plurality of voltage divider circuits comprises:
    a first resistor configured to receive the input signal; and
    a second resistor coupled between the first resistor and ground and configured to generate a corresponding one of the plurality of first signals.

5. The analog to digital converter of claim 1, wherein the at least one converter circuit comprises a plurality of converter circuits, and each of the plurality of converter circuits is configured to generate a corresponding one of the at least one digital output according to the reference voltage and a corresponding one of the plurality of second signals.

6. The analog to digital converter of claim 1, further comprising:
    a selector circuit configured to sequentially output one of the plurality of second signals to be a third signal,
    wherein the at least one converter circuit is configured to generate the at least one digital output according to the third signal and the reference voltage.

7. The analog to digital converter of claim 1, wherein a maximum level of the plurality of first signals is higher than the reference voltage.

8. The analog to digital converter of claim 1, wherein when the level of the input signal exceeds the first voltage detection range and is within the second voltage detection range, the controller circuit is configured to select one of the at least one digital output that is generated based on a specific signal, and the specific signal is a signal in the plurality of first signals that is generated by the second front-end circuit.

9. The analog to digital converter of claim 1, wherein an upper limit of a voltage range of the input signal converted by the second front-end circuit is higher than an upper limit of a voltage range of the input signal converted by the first front-end circuit.

10. The analog to digital converter of claim 1, wherein a lower limit of a voltage range of the input signal converted by the second front-end circuit is equal to or lower than an upper limit of a voltage range of the input signal converted by the first front-end circuit.

11. The analog to digital converter of claim 1, wherein levels of the plurality of second signals are not higher than the reference voltage.

12. A signal conversion method, comprising:
dividing an input signal to generate a plurality of first signals having different levels;
respectively sampling, by a plurality of front-end circuits, the plurality of first signals to generate a plurality of second signals;
generating at least one digital output according to the plurality of second signals and a reference voltage; and
determining a level of the input signal according to the at least one digital output and selecting one of the at least one digital output according to the level of the input signal,
wherein the plurality of front-end circuits comprise a first front-end circuit and a second front-end circuit, the first front-end circuit has a first voltage detection range, the second front-end circuit has a second voltage detection range that is higher than the first voltage detection range, and a voltage resolution of the first front-end circuit is lower than a voltage resolution of the second front-end circuit.

13. The signal conversion method of claim 12, wherein dividing the input signal to generate the plurality of first signals having the different levels comprises:
dividing the input signal according to different voltage divider ratios to generate the plurality of first signals.

14. The signal conversion method of claim 12, wherein a voltage range of the input signal converted by the first front-end circuit and a voltage range of the input signal converted by the second front-end circuit are partially overlapped or different from each other.

15. The signal conversion method of claim 12, wherein an upper limit of a voltage range of the input signal converted by the second front-end circuit is higher than an upper limit of a voltage range of the input signal converted by the first front-end circuit.

16. The signal conversion method of claim 12, wherein a lower limit of a voltage range of the input signal converted by the second front-end circuit is equal to or lower than an upper limit of a voltage range of the input signal converted by the first front-end circuit.

17. The signal conversion method of claim 12, wherein generating the at least one digital output according to the plurality of second signals and the reference voltage comprises:
generating, by a plurality of converter circuits, the at least one digital output according to the plurality of second signals and the reference voltage,
wherein each of the plurality of converter circuits is configured to generate a corresponding one of the at least one digital output according to the reference voltage and a corresponding one of the plurality of second signals.

18. The signal conversion method of claim 12, wherein generating the at least one digital output according to the plurality of second signals and the reference voltage comprises:
sequentially outputting one of the plurality of second signals to be a third signal; and
generating the at least one digital output according to the third signal and the reference voltage.

19. The signal conversion method of claim 12, wherein a maximum level of the plurality of first signals is higher than the reference voltage.

20. An analog to digital converter, comprising:
a plurality of voltage divider circuits configured to divide an input signal to generate a plurality of first signals, wherein the plurality of first signals have different levels;
a plurality of front-end circuits configured to respectively sample the plurality of first signals to generate a plurality of second signals;
at least one converter circuit configured to generate at least one digital output according to the plurality of second signals and a reference voltage; and
a controller circuit configured to determine a level of the input signal according to the at least one digital output and select one of the at least one digital output according to the level of the input signal,
wherein the plurality of front-end circuits comprise a first front-end circuit and a second front-end circuit, and a voltage range of the input signal converted by the first front-end circuit and a voltage range of the input signal converted by the second front-end circuit are partially overlapped or different from each other.

* * * * *